(12) United States Patent
Garmer et al.

(10) Patent No.: US 6,947,665 B2
(45) Date of Patent: Sep. 20, 2005

(54) RADIANT HEATING SOURCE WITH REFLECTIVE CAVITY SPANNING AT LEAST TWO HEATING ELEMENTS

(75) Inventors: Christopher J. Garmer, Rockville, MD (US); Feliks B. Kleyner, Montgomery Village, MD (US); Ilya M. Ayzman, Montgomery Village, MD (US); Igor L. Goldman, Montgomery Village, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 5 days.

(21) Appl. No.: 10/361,658

(22) Filed: Feb. 10, 2003

(65) Prior Publication Data

US 2004/0156625 A1 Aug. 12, 2004

(51) Int. Cl.$^7$ ............................................... H05B 3/00
(52) U.S. Cl. ...................... 392/411; 392/420; 392/422
(58) Field of Search ................. 392/411–413, 415–418, 392/420, 426, 428, 422; 219/405, 411, 390

(56) References Cited

U.S. PATENT DOCUMENTS

| | | | | |
|---|---|---|---|---|
| 1,231,750 A | * | 7/1917 | Kuhn et al. .................. | 392/422 |
| 3,761,678 A | * | 9/1973 | Eckles ......................... | 392/428 |
| 4,571,486 A | * | 2/1986 | Arai et al. .................... | 438/799 |
| 4,716,658 A | * | 1/1988 | Jacobi, Jr. .................... | 34/266 |
| 5,155,336 A | | 10/1992 | Gronet et al. | |
| 5,345,534 A | * | 9/1994 | Najm et al. .................. | 392/422 |
| 5,446,825 A | * | 8/1995 | Moslehi et al. .............. | 392/416 |
| 5,740,314 A | | 4/1998 | Grimm | |
| 6,023,555 A | | 2/2000 | Penelon et al. | |
| 6,121,579 A | * | 9/2000 | Aoki et al. .................. | 219/390 |
| 6,122,440 A | * | 9/2000 | Campbell ..................... | 392/420 |
| 6,210,484 B1 | * | 4/2001 | Hathaway ..................... | 118/724 |
| 6,259,072 B1 | | 7/2001 | Kinnard et al. | |
| 6,518,547 B2 | * | 2/2003 | Takahashi et al. .......... | 219/390 |
| 2001/0027969 A1 | * | 10/2001 | Takahashi et al. .......... | 219/390 |

FOREIGN PATENT DOCUMENTS

| | | | | |
|---|---|---|---|---|
| AU | 7577/32 | * | 7/1933 | .................. 392/426 |
| DE | 383360 | * | 10/1923 | .................. 392/428 |
| GB | 2376288 | * | 12/2002 | |
| WO | 91/10751 | * | 7/1991 | |

* cited by examiner

Primary Examiner—John A. Jeffrey
(74) Attorney, Agent, or Firm—Watts Hoffmann Co., L.P.A.

(57) ABSTRACT

A radiant source for heating a workpiece such as a semiconductor wafer includes a plurality of radiant heating elements, arranged in an array that is generally concentric about a source center axis. A reflector has a reflecting surface that bounds a cavity or channel that contains the heating elements, the reflector comprising walls that extend around the center axis and that are finished for reflecting radiant energy emitted by the heating elements to a region occupied by a wafer. The channel reflecting surfaces comprise at least a part of a plane and/or cylinder and/or a cone and/or a convex to the heating elements curved surface of revolution bordering or spanning two or more adjacent heating elements.

22 Claims, 14 Drawing Sheets

CENTER   INN CRCL   MID CRCL   OUTER CRCL

CENTER   INN CRCL   MID CRCL   OUTER CRCL 0  45  90  135 180 225 270 315 360

0  45  90  135 180 225 270 315 360

RADIANT HEATING SOURCE WITH REFLECTIVE CAVITY SPANNING AT LEAST TWO HEATING ELEMENTS

FIELD OF INVENTION

The invention relates to a heating source and more particularly to a heating source used in heating a workpiece such as a semiconductor wafer or similar object and more particularly to temperature dependent processes where the workpiece is heated with a heat radiating source.

BACKGROUND OF THE INVENTION

The speed of several types of semiconductor wafer processing depends on a process gas active ingredient concentration or delivery rate at the region of the wafer surface and also on the substrate temperature maintained at the wafer surface. A goal of treatment systems is to provide uniform temperature and active ingredients distributions across the wafer process area. In certain circumstances it is also important to maintain control over these process parameters during a temperature ramping period of a treatment process.

Unfortunately, the heating and process gas delivery are under control of separate process tool components and depend on the geometry and construction of the processing unit. Prior art heating and gas delivery components of a wafer processing system have been limited in achieving time and surface uniformity of action. As a result, the speed at which the temperature dependent process reaction takes place can be different at different wafer locations. This phenomenon is generally referred to as process non-uniformity. The process non-uniformity can result in overexposure to plasma with the subsequent damage of the wafers and other negative effects. During stripping, the non-uniformity slows the resist cleaning speed and therefore causes a decrease of wafer throughput of the stripping process.

Most of the process volumes or chambers are basically symmetric about a center axis, as is the wafer. The processes parameters applied to the wafer such as heating and the active plasma ingredient delivery should also be symmetric about the wafer axis. Generally, the boundary conditions for gas/species distribution and for heat exchange process on the wafer surface boundary also tend to be of rotationally symmetric about the axis. Therefore the process and temperature non-uniformity may be considered as a superposition of a radial and azimuthal components.

The radial component of process non-uniformity is measured along the wafer radius. This component in particular is a result of incomplete mutual compensation of the temperature and plasma concentration across a wafer diameter. For example, a lower temperature in the center of the wafer would be needed to compensate for a higher plasma species activity at the center area of the wafer. If the heater design cannot compensate enough or overcompensates, a radial process non-uniformity results.

An azimuth component of process non-uniformity is measured as a degree of process speed deviation along a specified circumference on the wafer surface. This component of non-uniformity is mostly a result of a local asymmetry that is specific to the process chamber/gas supply system design or is produced by different tolerances in the system. For example, such asymmetry may be due to gas flow asymmetry at a chamber door zone or a difference in individual heating elements intensity or excessive tolerance of a radiant heater bulb filament position and (or) or bulb base mounting orientation.

Simultaneous achievement of both thermal uniformity and uniform active ingredient concentration to the region of the wafer over the process area can be difficult to provide. For example, process gas supply and process gas exhaust design for downstream microwave ashers can cause substantial radial and azimuth non-uniformity in active species delivery. The radial process non-uniformity component resulting from radial non-uniformity of temperature and radial non-uniformity of the active species delivery for a design that are basically symmetric with respect of the wafer axis could be mutually compensated. Developing of the heating sources with more flexibility in optimization of heat distribution over the wafer surface becomes important in achieving the required compensation.

For brevity of explanations, in the following text the terms Uniform Heating and Uniform Temperature are used to specify the degree of difference between the actual temperature and heat rate radial distribution compared to the distribution required for ideal compensation of the non-uniform radial plasma activity, mentioned above. The terms Process Uniformity and Azimuthal Uniformity of Heating and Temperature are applied in their original sense i.e. as degree of deviation from the corresponding statistically averaged values.

In U.S. Pat. No. 6,023,555 a positive effect has been claimed due to use of radiant heating apparatus that includes a plurality of bulbs each associated with two individual reflectors—an ellipsoidal shaped back reflector and an additional—tubular reflector.

The system disclosed in the '555 patent also exhibits certain problems. The elliptical reflector in combination with a tubular reflector creates strong local process speed dependence on individual parameters and space orientation for each set of bulb/reflector. This is because the radiant energy of each set is concentrated by individual reflectors in relatively narrow areas of the target positioned with respect to each set. This prior art arrangement can result in azimuthal and especially radial non-uniformity of the temperature and, therefore, processes speed non-uniformity. An additional source of non-uniformity is inconsistency of an individual reflector's shape, finish quality, position and orientation due to dimensional tolerances of the reflector's and bulb mountings.

The numerous manufacturing and assembly tolerances also include individual bulb intensity, filament spatial position, reflectors and bulbs base installation that can result in non-uniformity of temperature and therefore, processing rate.

Practice has shown that to achieve an adequate degree of process uniformity in the structure disclosed in U.S. Pat. No. 6,023,555 requires an individual selection of bulb and reflectors for the heaters in production. Additionally, the system disclosed in the '555 patent requires an individual realignment of the heaters during production process testing because of a strong correlation of process uniformity to individual bulb properties and combined mechanical tolerances resulting in difference in the bulb filament spatial positions.

The minimization of all individual bulb positioning tolerances, extending from the wafer surface through the heating chamber and heater design, to the filament spatial orientation appears to be difficult to achieve.

The random combination of tolerances for newly built heaters in some cases has caused high non-uniformity and required the whole assembly to be rejected during manufacture. An individual parts alignment and selection in this cases is not sufficient. U.S. Pat. No. 6,259,072 B1 describes a two level zone controlled radiant heating apparatus with focused reflectors. As practical experience shows, successful application of this configuration, may require the zone map development performed individually for each manufactured reflector what is acceptable only for expensive tools. In addition, power zoning during the wafer temperature ramp up is evidence of inefficient power usage for heating. Instead of optical redistribution of excessive heat to areas with lower wafer temperature, part of the available energy is simply not used because of the less than 100% zone power applied to the some of the array bulbs.

This is a natural problem of any pan-shaped one-wall asymmetric design where the radiant energy directed to the center axis is not under designer control i.e. energy is not redirected to the proper area of the wafer to improve uniformity.

Another problem with tubular or pan-shaped reflectors is loss of part of the bulb energy which is directed parallel or close to parallel to the wafer plane. This part of the radiant energy is absorbed by other bulbs and numerous back and force reflections with partial absorbtion on the reflector surfaces before the radiant energy leave the heater in the wafer direction. The total heating effectiveness of a such an array drops due to the absorbed energy lost without heating the wafer.

Analysis of the equipment built in conformity with the '072 patent shows that the principal effect of the part-to-part deviation is azimuth temperature non-uniformity. It is similarly exaggerated at the wafer area across each ring of bulbs due to use of separately focused reflectors for each ring of bulbs.

Note, that for each individual bulb there is an effect of non-uniformity amplification because of the focusing effect of each individual bulb in a direction across the parabolic areas of the reflector surface.

In these prior art systems, the heating elements are positioned by plugging in electrical sockets, which are in turn attached to the reflector assembly. Additional to these tolerances that generate heating non-uniformity, is a bulb base to electrical socket position tolerance.

SUMMARY OF THE INVENTION

The present invention provides a radiant heating device with high consistency of heating conditions in both a radial and an azimuth orientation across a plane of a workpiece such as a wafer. Use of a reflective inner wall and angled radiant energy bulbs combined with an optimized shape of the inner and outer wall and bottom reflecting surfaces (in one embodiment the radiant heating device is oriented to have what can be referred to as a bottom surface) provide uniform heat distribution over a wafer surface with a more compact design. A radiant heater constructed in accordance with one embodiment of the invention results in more uniform processing parameters across the wafer surface as well as more uniform process speed and heating effectiveness.

The reflector structure of one embodiment of the invention involves plane surfaces and/or simple surfaces of revolution shaped to provide a better uniformity of process conditions and highly effective energy use.

The relatively flat non-focusing planar, cone, cylindrical or convex curved reflecting surfaces reflect heat energy from a group of or all of the heating elements and do not focus an individual bulb's energy at the workpiece region. A convex (as seen from a position of the heating elements) internal wall disperses energy of each bulb to the even wider area of wafer surface and makes heat delivered to the wafer from each bulb smoother, less concentrated. The effect is opposite to the focusing property of prior art parabolic or elliptical or similar, concave (as seen from a position of the elements) surfaces, including a cylinder outer wall type design. Energy from each individual bulb reflected from a prior art concave surface is concentrated at a smaller area of the wafer and equalizing participation of other bulbs at this concentrated area is less. Practice of the invention lessens non-uniformity caused by prior art heating devices caused by individual or group tolerances resulting from manufacturing and assembly because the heating at each locale is a result of an increased superposition of energy from many bulbs that makes deviations of individual properties of each bulb/reflector less pronounced.

A defocusing effect can be made even stronger if outer wall reflecting surface is made to be convex (as seen from a position of the heating elements). In one embodiment a convex outer wall portion formed from a curved line rotated about a center axis is used. This effect could also be used on a bottom and on inner surfaces of revolution, adding (as seen from the position of the bulbs) more convexity in direction perpendicular to the natural convexity of the inner cylinder or cone. This produces additional defocusing or divergence of radiative heat reflected on the bottom and outer wall reflecting surfaces.

Use of an internal reflecting wall in addition to commonly used outer and bottom reflecting surfaces results in a reflector shape that is like a two-wall channel which may or may not have a well defined bottom reflecting surface. The internal wall serves as additional feature giving more flexibility in the bulbs radiation redirection. Properly optimized in shape and position of the reflecting surfaces the invention achieves a uniform heat distribution and higher overall heating effectiveness than a reflector without an inner wall. Use of the term "walls" and "bottom" is to describe one exemplary embodiment wherein the workpiece is positioned horizontally above the heating source. It is appreciated, however, that the invention has utility in other orientations and suitable terminology would be substituted in describing the invention with its components in alternative orientations.

Thus, it is an object of the present invention to provide a multiple heating element source for uniform heating using a common reflecting surface for all or at least some of the heating elements. An exemplary embodiment includes a channel type reflecting surface that diminishes the individual and group assembly tolerances that can effect heating target temperature uniformity. At least some of the reflecting surface is defined by a surface of revolution around the heater axis. The channel reflector's cross-section shape combines straight lines and curved lines selected to produce a specific distribution of radiant heat intensity over the wafer surface for specified applications.

For manufacturing purposes, the shape of the surfaces of revolution above can be approximated with an inscribed polyhedron surface where the number of faces, for example, may be equal to the number of heating elements.

It is a further object of the invention to provide a heating source that can be used for different type of processes or/and tools wherein a reflecting surface is defined by a combination of separate coaxial rings or planes or surfaces of revolution or polyhedrons having a common axis.

It is a further object of the invention to provide a heating source that can be modified by installation of inserts to modify the reflecting energy distribution for alternate processes or applications.

It is still a further object of invention to provide heating elements spatial positioning independent from their electrical connection attachment for more consistent filament alignment in relation to the heating target surface.

BRIEF DESCRIPTION OF THE DRAWINGS

FIGS. 10A, 10B, 10C and 10D are top, side, bottom and side views of a socket that supports a lamp;

(FIGS. 19 and 20 are FIGS. 4 and 5 from U.S. Pat. No. 6,023,555).

DETAILED DESCRIPTION OF PREFERRED EMBODIMENTS

Figure 19:
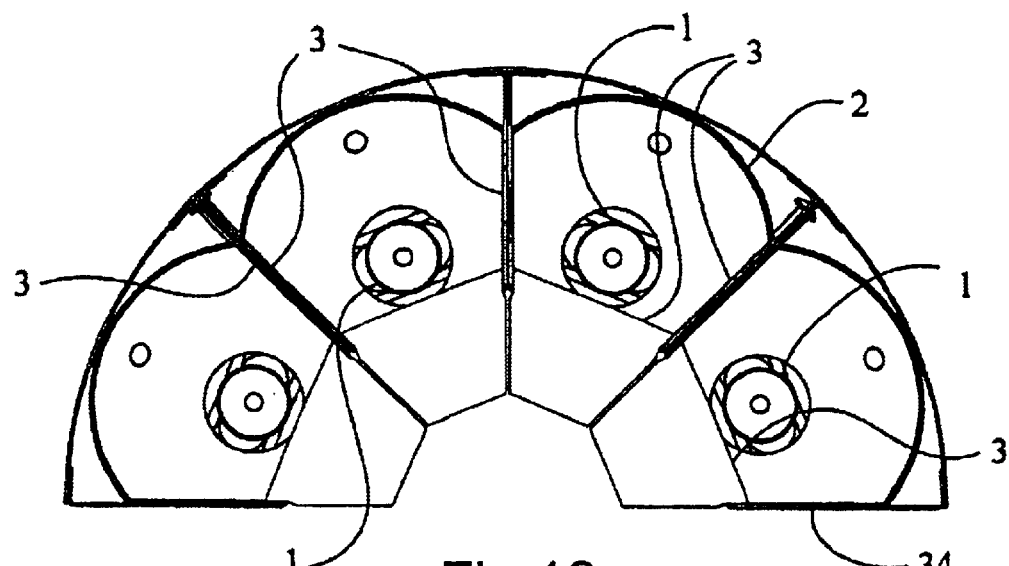
FIG. 19 shows a plan view of a prior art radiant heating device for use in radiant heating of a semiconductor work piece during processing.
Figure 20:
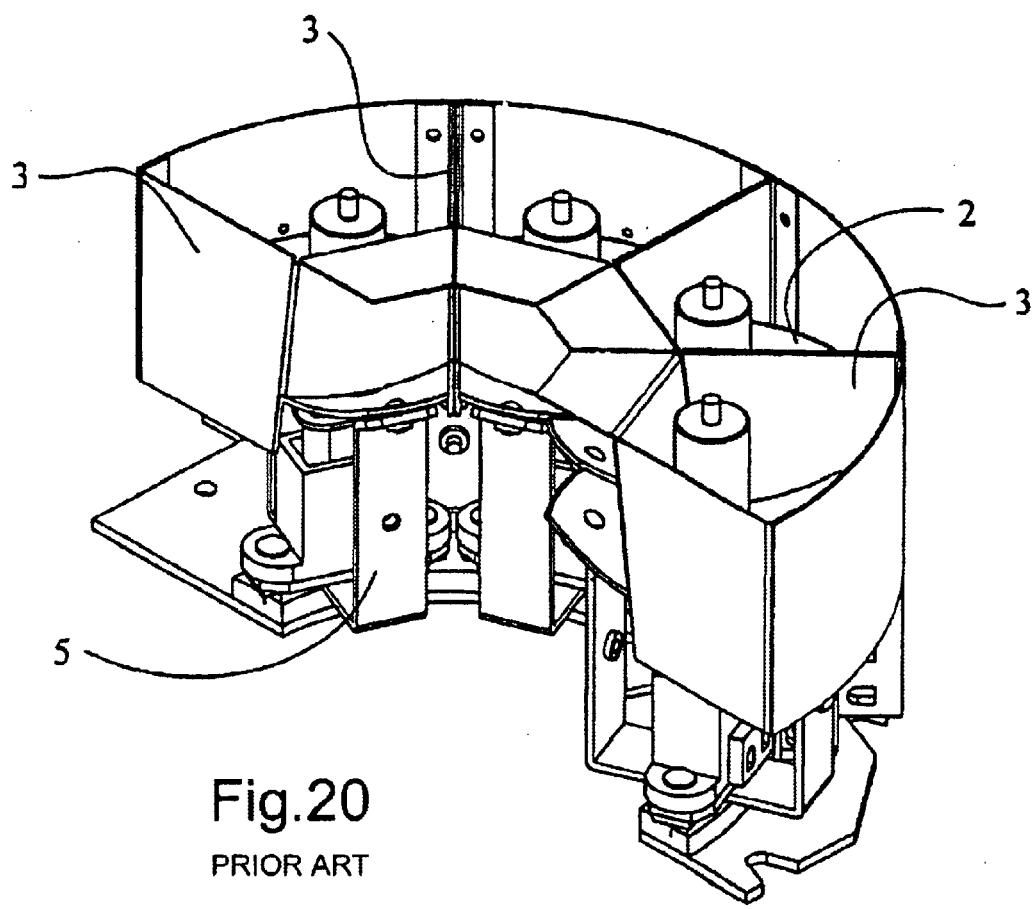
FIG. 20 shows the perspective view of the same prior art embodiment shown in FIG. 19.

FIG. 19 is a plan view of a prior art radiant lamp array for wafer heating in semiconductor processing chambers. FIG. 20 shows a perspective view of the apparatus of FIG 19. These depictions are similar to depictions shown in U.S. Pat. No. 6,023,555 to Penelon et al. The '555 patent is incorporated herein by reference. In each depiction, one half of an array of heating elements of sources is shown, the second half which is not shown is symmetric to the part shown in FIGS. 19 and 20. In the plan view of the FIG. 19 are also shown four of the eight individual heating elements 1. As described in the '555 patent they are quartz halogen bulbs.

FIGS. 19 and 20 also depict ellipsoidal shaped back reflectors 2 combined with the adjacent tubular reflectors 3 which have reflector surfaces that extend in a direction parallel to an elongated axis of an associated heating lamp. Each of the ellipsoidal and tubular reflectors is mounted next to an associated a single bulb heating element to act as an individual concentrator of radiant energy in the direction of a semiconductor wafer.

The prior art reflectors 2,3 shown in FIGS. 19 and 20 achieve relatively strong radiant energy focusing at the wafer surface in the vicinity of the reflector's associated bulb. The superposition of the heat delivered to the wafer from other lamps in the array of lamps shown in FIG. A is minimized. Individual tolerances in bulb power, filament and reflector position are pronounced or relatively high due to the focusing effect of the individual reflectors in adjacent to corresponding bulb wafer area. Sufficient radial and especially azimuth uniformity is very difficult to achieve by such an arrangement.

The tubular reflectors of the prior art and any pan-shaped reflector not having an internal reflecting wall introduces a loss of radiant energy because they function similar to a black body. Energy from the bulbs which is directed parallel or nearly parallel to the plane of the wafer plane experiences numerous reflections before it leaves the reflector. The numerous reflections causes unavoidable heat loss due to absorption on the reflector walls so that some of the power output from the radiant source is wasted.

As seen from the depiction shown in FIG. 20 each bulb is plugged into electrical socket, which in turn is fastened to a base of the apparatus. The reflectors 2 are fastened to mounting brackets 5 that are independent from the bulb mounting base. Considering two numerous link independent dimensional chains extending from the wafer-chamber-base-socket—filament-back to wafer and wafer-chamber-base-bracket-both reflectors-back to wafer, the accurate filament-reflector-mutual position and each of them—position relatively to heating target is difficult to provide. This is an additional source of wafer temperature and therefore ash rate non-uniformity.

As already noted, a random combination of part tolerances results in an uneven wafer irradiance and therefore unacceptable poor uniformity performance, requires frequent realignment of the arrays during production testing and can even result in rejection of the heater assembly during manufacturing process performance testing. The values of non-uniformity received with the prior art construction are compared (below) to the results of the identical test performed with a proposed embodiment of the present invention.

Figure 1A:
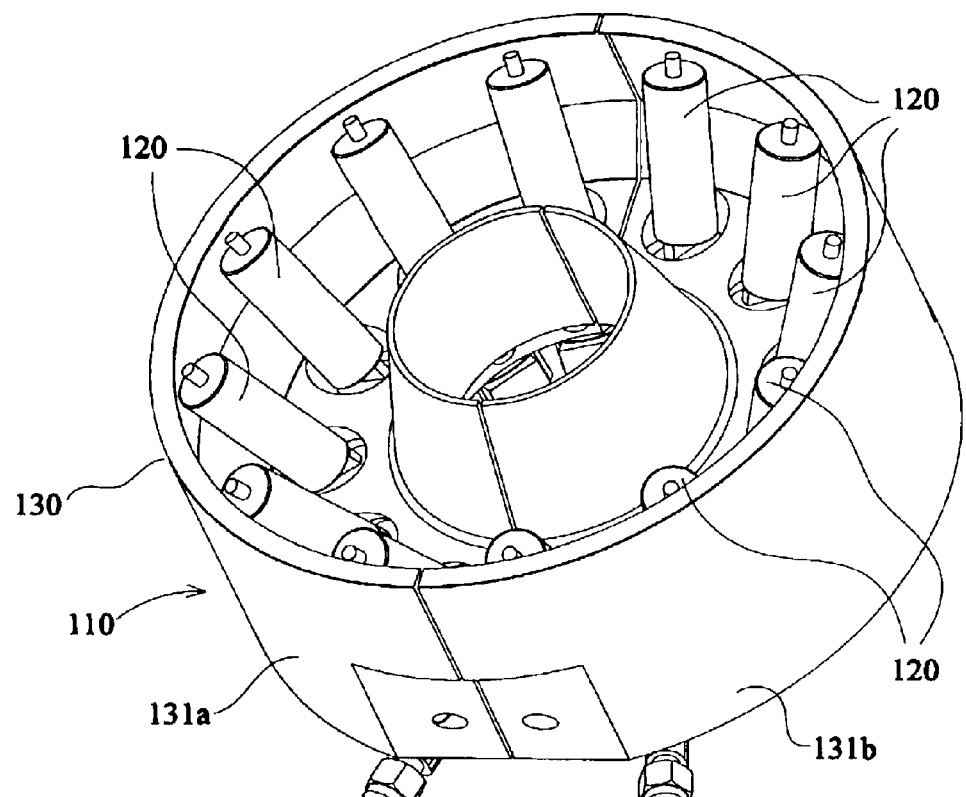
FIG 1A is a perspective view of a radiant heating device constructed in accordance with an exemplary embodiment of the present invention.

FIG. 1A illustrates a radiant energy source 110 for heating a semiconductor wafer 112 (FIG. 5) positioned relative to the source 110. The radiant energy source includes a plurality of radiant heating elements 120 arranged in an array that is generally concentric about a source center axis 122. The source 110 also includes a base 130 constructed from a machined aluminum body that defines a two-wall channel or cavity 132 that bounds the heating elements from all directions except the direction of the wafer. Exterior and interior channel walls 134 that bound the cavity along inside and outside walls and in the illustrated embodiment extend completely around the center axis 122 reflect radiant energy emitted by the heating elements 120 to a region occupied by a wafer 112. In the exemplary embodiment of the invention at least some of the walls are defined by a cylinder and/or a cone surface formed by revolving a line about the center axis 122.

Figure 1B:
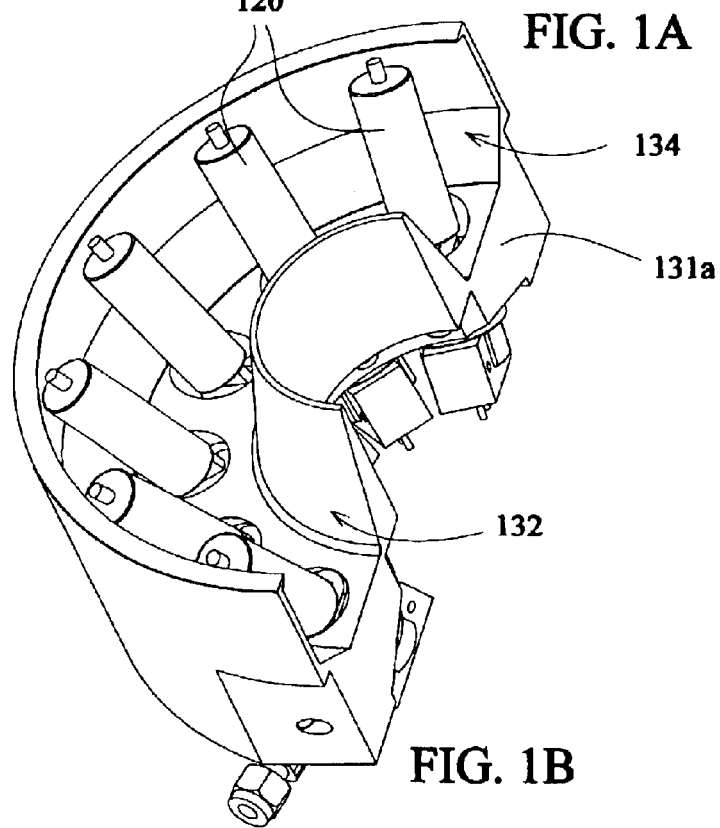
FIG. 1B is a perspective view of one of two symmetric parts of the radiant heating device shown in FIG. 1A.

As seen in FIGS. 1A and 1B the exemplary embodiment of the invention is formed by two symmetric body halves 131a, 131b that together form the base 130. A two half design is suitable for downstream plasma ashers aligned with the bottom center position of the process exhaust line. In other cases the one-piece design is more suitable and cheaper to manufacture.

Figure 2:
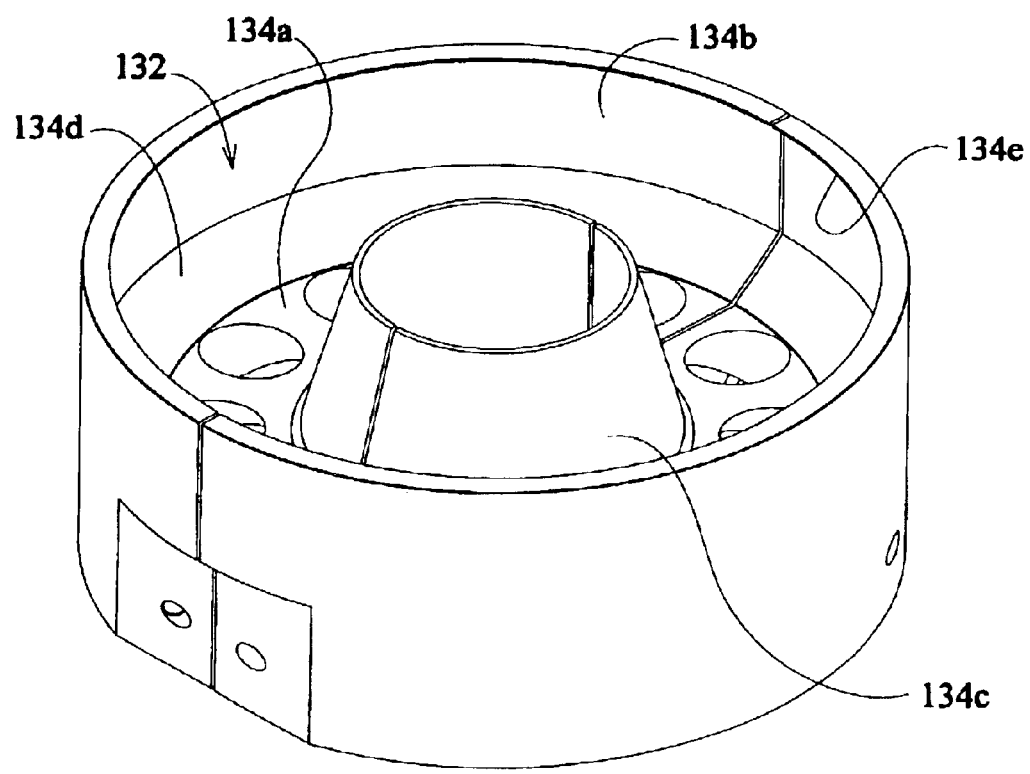
FIG. 2 is a perspective view of a base or mounting structure of the radiant heating device of FIG. 1A.
Figure 3:
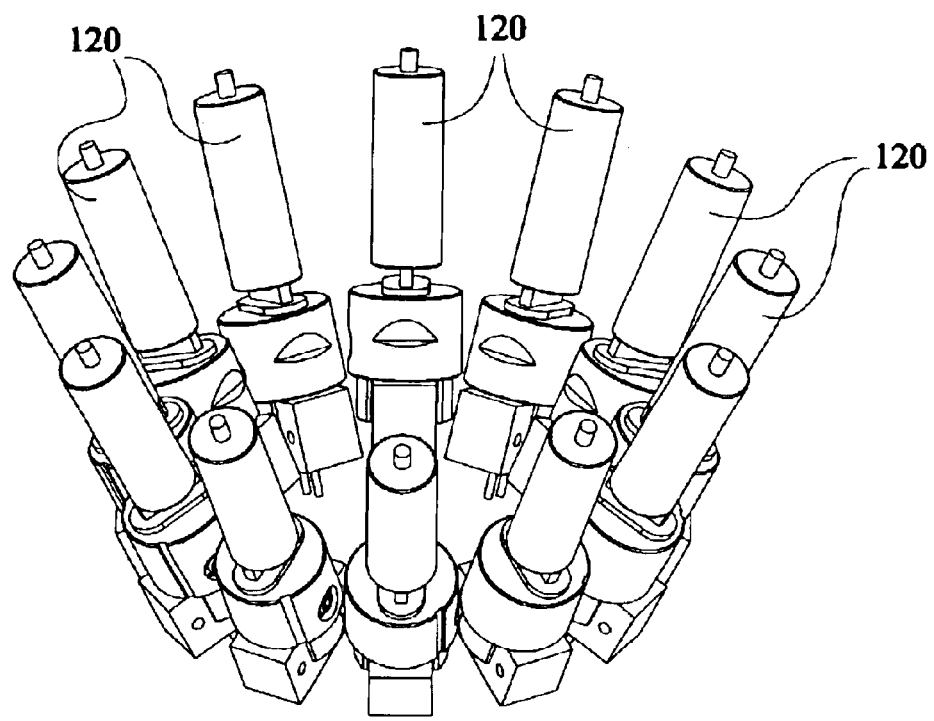
FIG. 3 is a perspective view of an array of heating elements including mounting bushings and electrical sockets.
Figure 4:
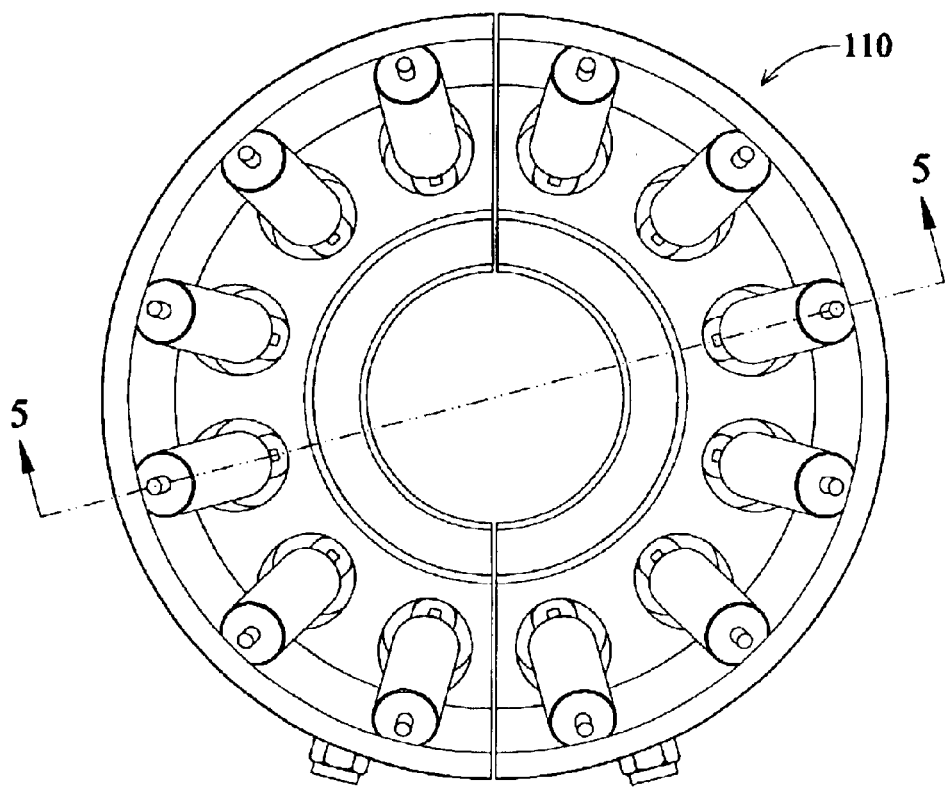
FIG. 4 is a top plan view of the radiant heating device shown in FIG. 1A.
Figure 5:
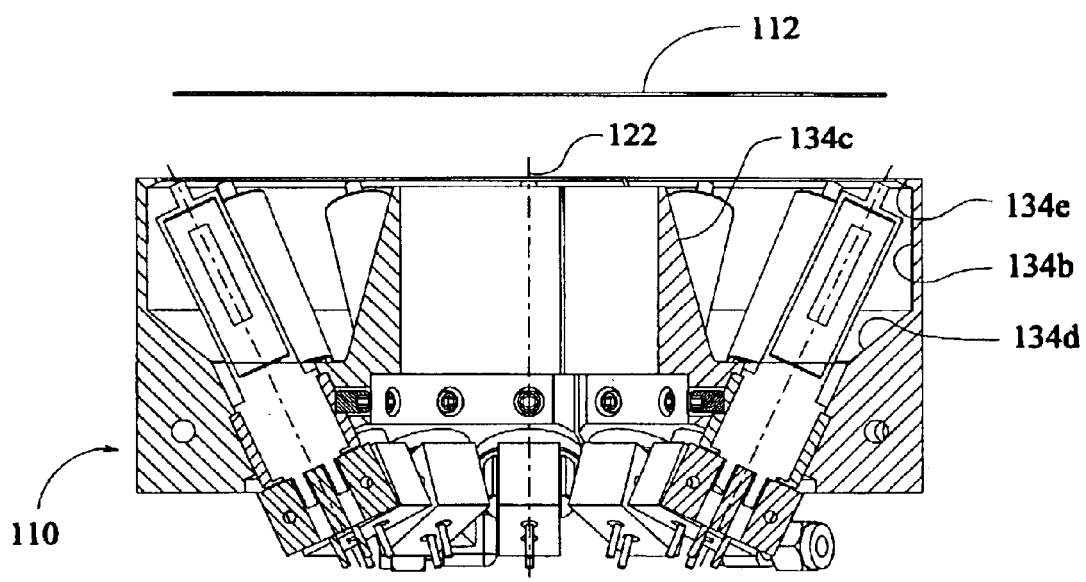
FIG. 5 is a section view as seen from the line 5—5 in FIG. 4 with a wafer position shown.

Turning to FIGS. 2 and 5, the reflecting surfaces that bound the cavity include a bottom plane wall 134a, an outer wall made from a combination of a generally vertical cylinder outer wall 134b and cone shaped wall 134d, a cone shaped inside wall 134c, and upper back reflecting cone surface 134e. The surface 134e defines a lip having an overhang that reflects radiation back toward the region of the bulb. This lip allows radiation which otherwise would miss the target to be returned to the region of the channel so that energy reflects again from the reflector surfaces and is redirected back to the wafer.

The feature is important for creating an effective compact heater of higher power, that allows an increase in wafer heating speed and therefore improves the tool's productivity. If more bulbs are used, in order to achieve this goal, the heater and heater output optical diaphragm generally become larger and may exceed the wafer size. Without the returning lip, part of energy directed out of the heater will miss the wafer area and cause loss of energy and reduce the effectiveness of the heating source. Use of a larger number of bulbs causes the energy loss to be greater.

The lip shape is not necessarily a cone and may be optimized for uniformity requirements. The lip's internal diameter is most preferably selected to return all the rays which otherwise miss the wafer. Use of the lip application is then more effective than if the reflector's optical diaphragm is larger than the wafer.

In accordance with an exemplary embodiment of the invention the walls 134a–134e are plate coated with a gold finish that reflects heat from these walls with a high efficiency. The reflector walls shown in the FIGS. are coaxial with the axis 122 and as was mentioned, define an inner, outer and bottom surfaces of the reflecting channel that bounds the bulbs pattern on three sides, excluding the direction facing the wafer. More than one generally circular array of bulbs positioned around the same axis could be used within the reflecting channel, for example for larger wafer size machines or in a case of smaller bulbs applied.

Figure 6:
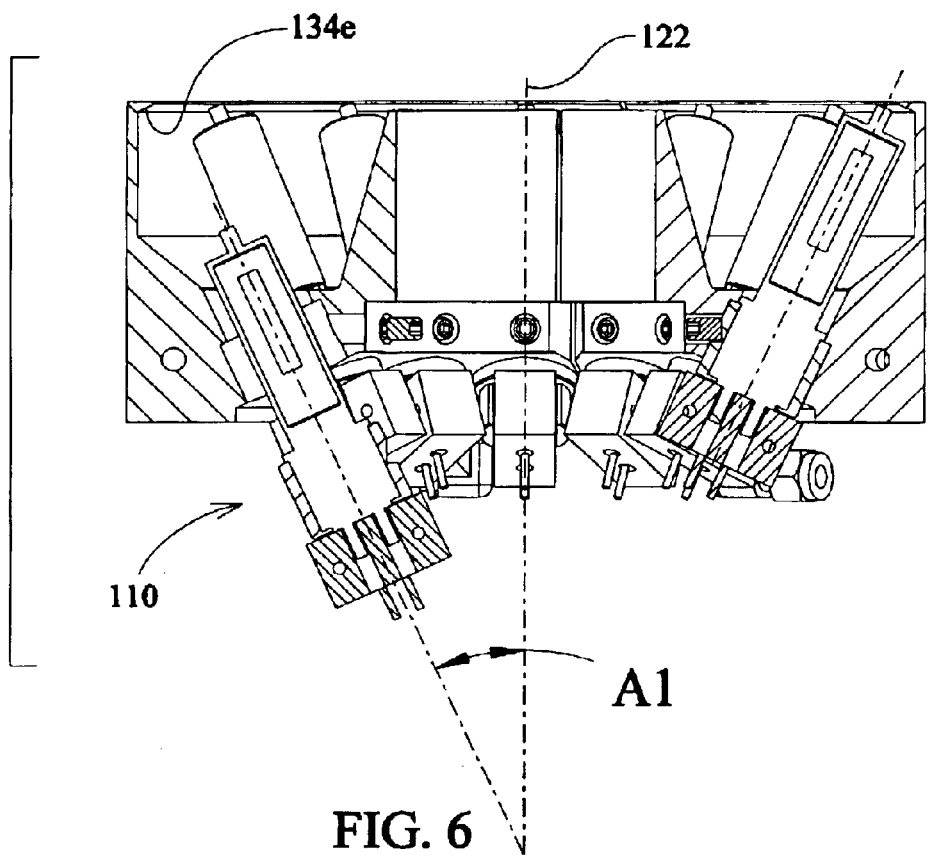
FIG. 6 is a section view of the radiant heating device showing a lamp and the lamp's mounting socket as they are removed from the heating device.
Figure 7:
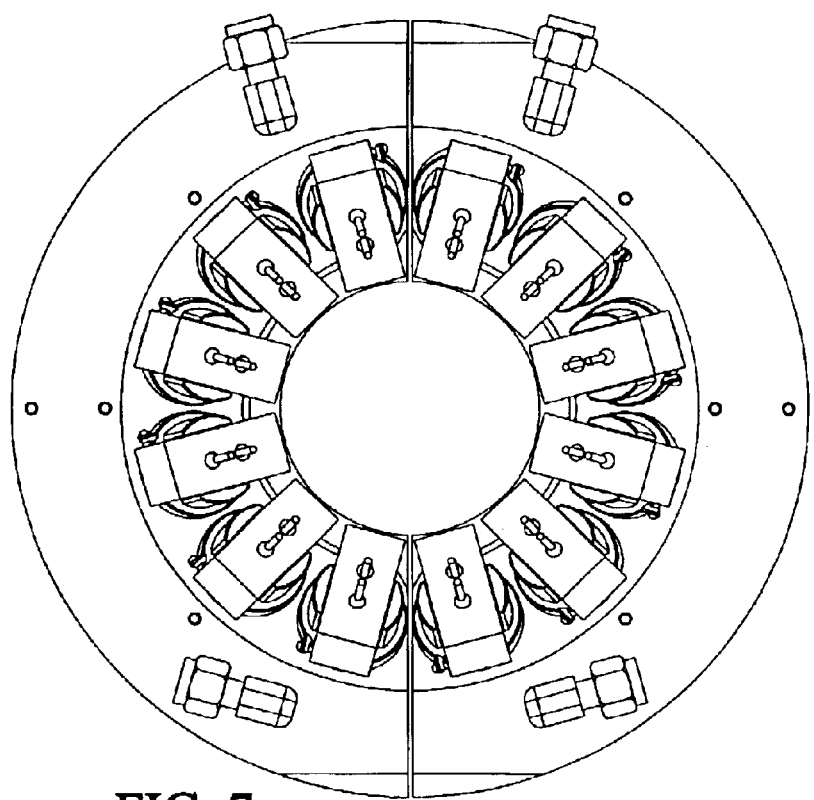
FIG. 7 is a bottom plan view of the radiant heating device of FIG. 1A.

The heating elements 120 include an elongated bulb 138 (FIG. 9) having a center axis that is oriented at an angle A1 (FIG. 6) with respect to the array's center axis 122. In accordance with the exemplary embodiment of the invention there are 12 bulbs that are arranged in a circular symmetric pattern within the described reflecting channel or cavity 132.

Figure 8A:
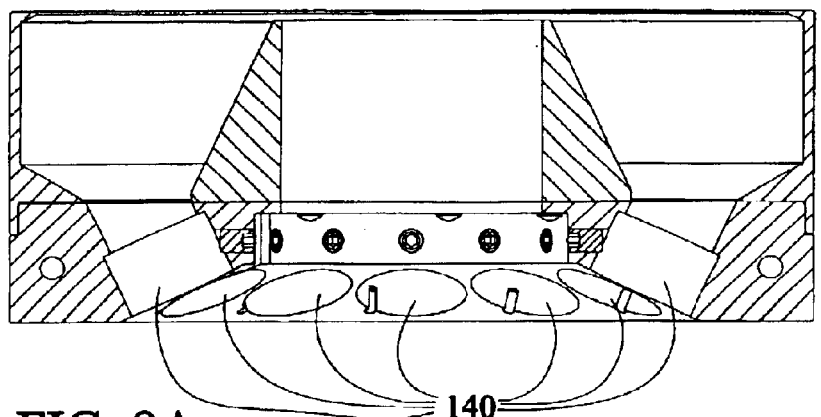
FIGS. 8A and 8B are section views of a the lamp mounting base.
Figure 8B:
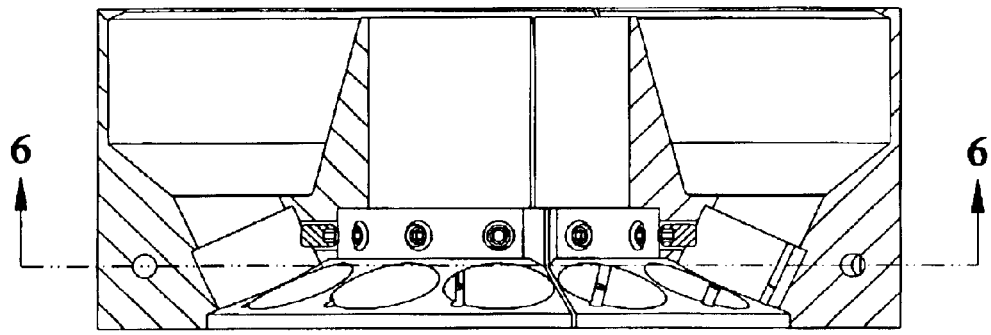
Figure 8C:
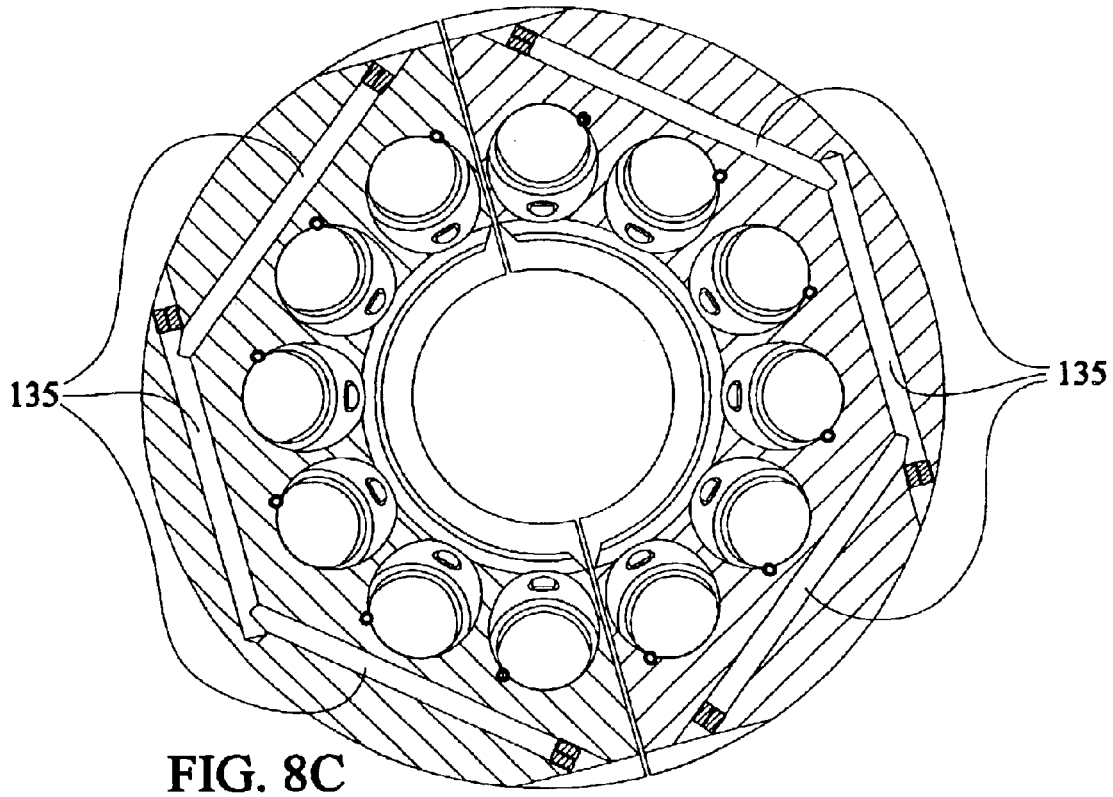
FIG. 8C is a section view as seen from the line 6—6 in FIG. 8B

The aluminum body halves 131a, 131b are water-cooled by means of running water through channels 135 made in the reflector body. The elongated bulb 138 of each of the heating elements 120 is oriented by a passageway or opening 140 (FIG. 8A) that extends from a bottom in one of the two halves 131a, 131b and extends upwardly to meet the reflecting cavity/channel 132 in the base 130.

Figure 9:
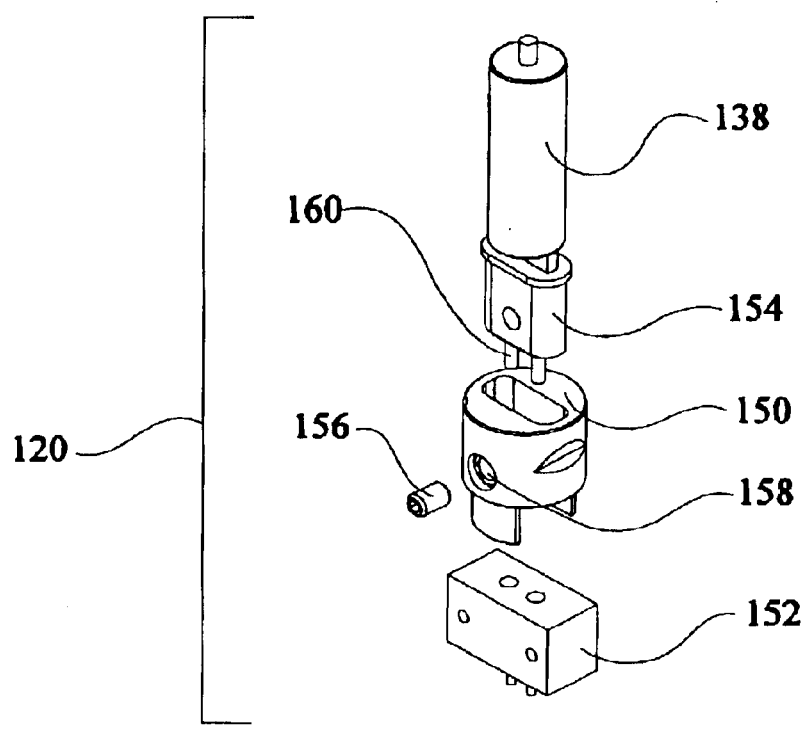
FIG. 9 is an exploded perspective view of a lamp, electrical socket for the lamp and lamp mounting bushing with the bulb fastening screw.
Figure 10A:
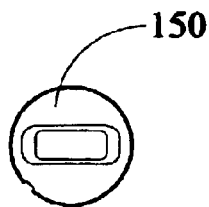
Figure 10A:
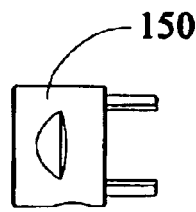
Figure 10C:
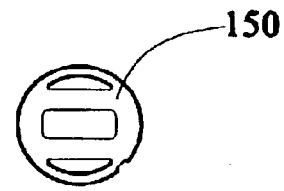
Figure 10D:
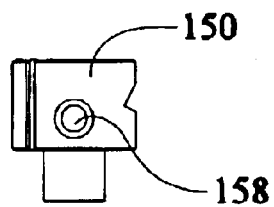

The heating elements 120 include halogen bulbs 138 that are commercially available as part no. J1H240V-1000WCH from USHIO. These bulbs are mechanically fastened to the reflector base by means of an intermediate bushing 150 (FIG. 9). The bushing 150 is made from high thermal conductivity material such as aluminum to transmit heat away from the bulb seal in order to prevent its overheating. The bushing 150 defines a slot that extends through a body of the bushing to accommodate a base 154 of the bulb. The orientation of the bulb is fixed by a screw 156 that passes through an opening 158 in the bushing so that the bulb's base is slipped into the bushing and the screw is tightened to engage the base thereby fixing the orientation and position of the bulb 138. Contact pins 160 that extend from the base 154 engage a socket 152 and circuitry coupled to the socket for controllably energizing the bulb 138.

The electrical sockets 152 are attached to the bulbs independently of the bulb support provided by the bushing 150 and do not affect the bulb orientation. This separate mounting helps avoid the extra long dimensional tolerance chain needed to align each bulb filament relatively to the wafer. The disclosed mounting arrangement therefore improves the temperature uniformity of the wafer and in turn-process performance uniformity.

The specific bulb distance from the array center axis 122, the angle A1 between a center axis of a given bulb 120a to the array center axis 122, the diameters and angles of the reflecting cone and cylinder surfaces for the described preferred embodiment were experimentally selected to optimize resist striping or ashing performance including uniformity of resist removal for applications of two different types process chambers that are currently available for use with prior art heater designs. It is stressed that the inner surface enhances a capability of the heater to achieve a uniform radial energy distribution over the target area occupied by the wafer.

As seen in the FIGS., the wafer heating area that is in the vicinity of a given bulb is not shielded by the array or structure from the radiation from the other bulbs in the array. The radiation intensity at a given point on the wafer is equal to the sum of all participating bulbs radiation falling at a given area. Note also, that the bottom and side surfaces 134a, 134b, 134c, 134d that border the channel do not produce individual bulb focusing effect. This might not be the case for an elliptical, parabolic or other curved, concave surface if such surfaces were incorporated in the reflector. The two factors above make individual bulb power tolerances and individual filament alignment tolerances to some degree mutually compensating and have less affect on the wafer temperature uniformity and therefore process uniformity.

Figure 13:
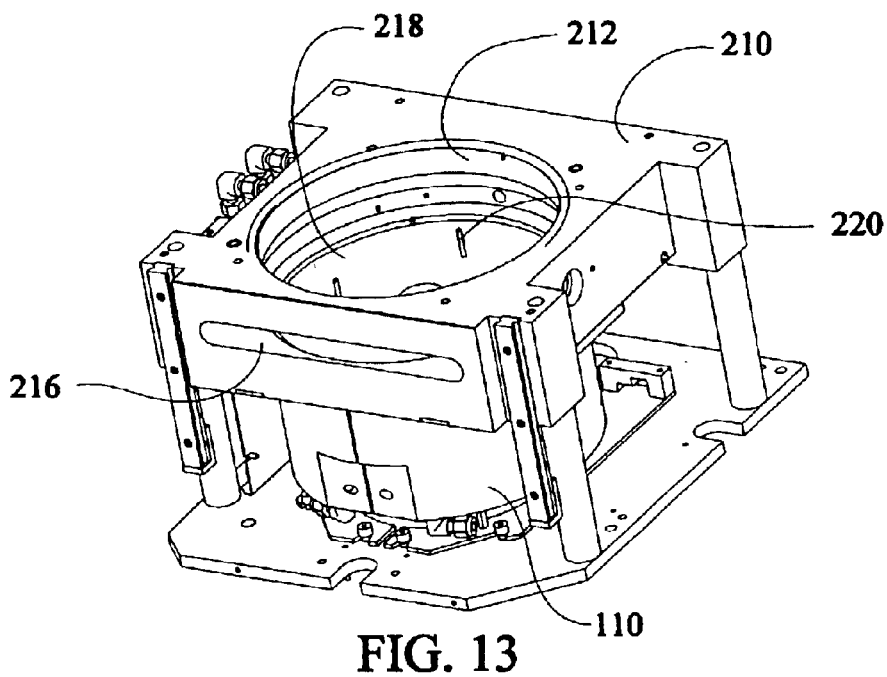
FIG. 13 is a perspective view of a process chamber for heating a workpiece such as a semiconductor wafer.

FIG. 13 depicts a process chamber 210 that contains the radiant energy source 110. The source 110 is depicted in FIG. 13 positioned relative to a top of the process chamber including a recess 212. During use of the chamber, the recess or cavity is bounded from above by a baffle plate (not shown) having holes that extend through the plate. A process gas flows through these holes in the baffle plate to a region occupied by the wafer. A gate (not shown) on a side of the chamber 210 opens and closes to allow wafers to be inserted into and removed from the chamber by a wafer passageway 216 that extends into the chamber cavity. A robotic arm (not shown) moves the wafers, one at a time, into the chamber interior and places them on a quartz window 218 having upstanding pins 220 on which the wafer rests. Heat from the source lamps 120 passes through the quartz window 218 (which is positioned above the lamps and separates the heater lamps from the wafer processing volume) during wafer process such as during the process of removing photoresist from selected wafer regions.

Figure 11A:
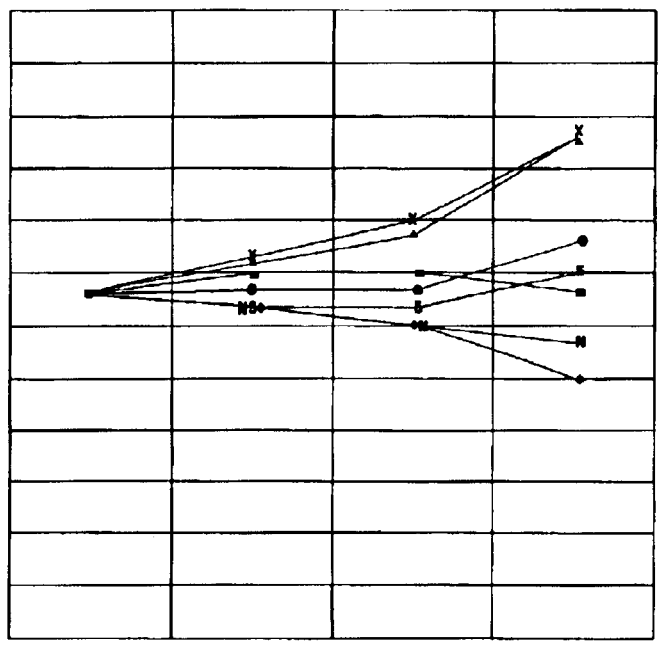
FIGS. 11A, 11B, 12A and 12B are depictions of test data comparing performance of the invention with the prior art.

The FIG. 11A depicts results of photo resist removal test processing performed with a prior art heater described above in conjunction with FIGS. 19 and 20. Each line on the graph depicts a thickness of removed resist at different radial directions (0, 45, 90 . . . 315 degrees for example). The overall standard non-uniformity removal characteristic for this wafer is about the current spec value for this type of process chamber. The FIG. 11A depiction illustrates an acceptable deviation, but one that is not easily achieved with the prior art system of FIGS. 19 and 20. Initial test results of a newly built array (not yet adjusted) are more likely to be in a range by 30–70% larger and this deviation is considered unacceptable. With a prior art system such as that depicted in FIGS. 19 and 20, a number of the bulbs and reflectors positions realignment attempts is usually required before an acceptable non-uniformity of the photoresist amount removed charted in FIG. 11A is achieved.

Figure 11B:
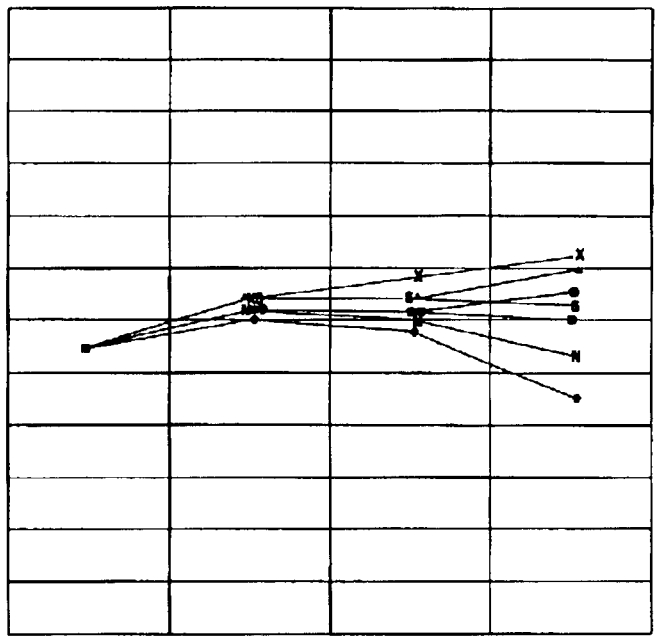

The improved results obtained at identical conditions with the invention are shown at the same scale in FIG. 11B. This graph depicts radial distribution of the thickness of the removed photoresist. As seen, a deviation range of about one half the amount on FIG. 11a is achieved. Overall that roughly corresponds to half the non-uniformity achieved by the prior art array discussed above in connection with FIGS. 19 and 20.

Figure 12A:
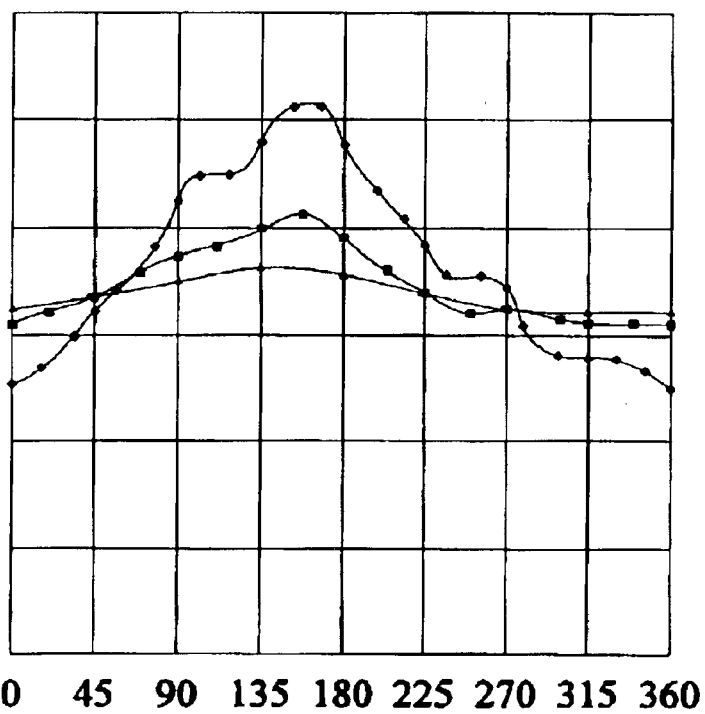
Figure 12B:
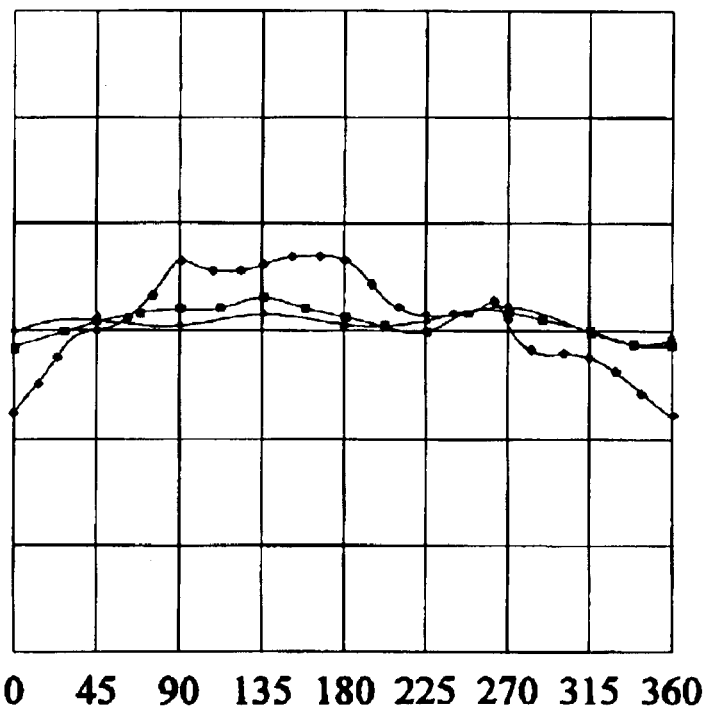

The comparison of an azimuthal component of non-uniformity for the very same pair of wafers processed at the same run shown in the FIGS. 12A and 12B at the same scale. Depicted in the FIG. 12A, the range of the azimuth deviations of amount removed for the outer, mid-radius and inner area of wafer corresponds to the current spec non-uniformity requirements These test results were obtained with the prior art heater array depicted in FIGS. 19 and 20.

While maintaining other conditions, the test results achieved through practice of the invention are approximately by 2.7; 1.7 and 2.5 times better correspondingly for outer, inner and mid-radius circular pattern measurements (FIG. 12B).

As these test results FIGS. 11A, 11B, 12A, 12B indicate, both components (radial and azimuthal) of nonuniformity are considerably better with the invention compared to the prior art.

Use of the invention dropped overall plug and play non-uniformity by 30 to 75% compared to plug and play results with the embodiments of FIGS. 19 and 20. The overall plug and play results are consistent from one bulb array to the next while they are not consistent for the currently used embodiments of FIGS. 19 and 20. The plug and play results for these prior art systems are often out of spec. The numerous realignments in manufacturing cannot guarantee the required results. Even when the specified uniformity is achieved, uniformity with the invention is still by 25–40% better and it is achieved plug and play.

A bulk strip processing of wafers requires complete resist removal from the wafer surface for the shortest possible period of time. The process duration is determined by the lowest process speed on the wafer surface. At the same average ash rate, more uniformly processed wafers will be completely clean of resist more quickly. This is why the improved process uniformity, achieved with the invention, provides higher throughput than the prior art arrangement.

In addition to uniform processing, the exemplary embodiment has increased the ramp rate at which wafer temperature increases by about 40%. This result has been achieved when compared to the prior art of U.S. Pat. No. 6,023,555 which occupies the same space or volume as the illustrated exemplary embodiment. Therefore, the invention provides a compact heater of high heating efficiency capable of decreasing the total process time and increasing productivity of the tool.

Figure 14A:
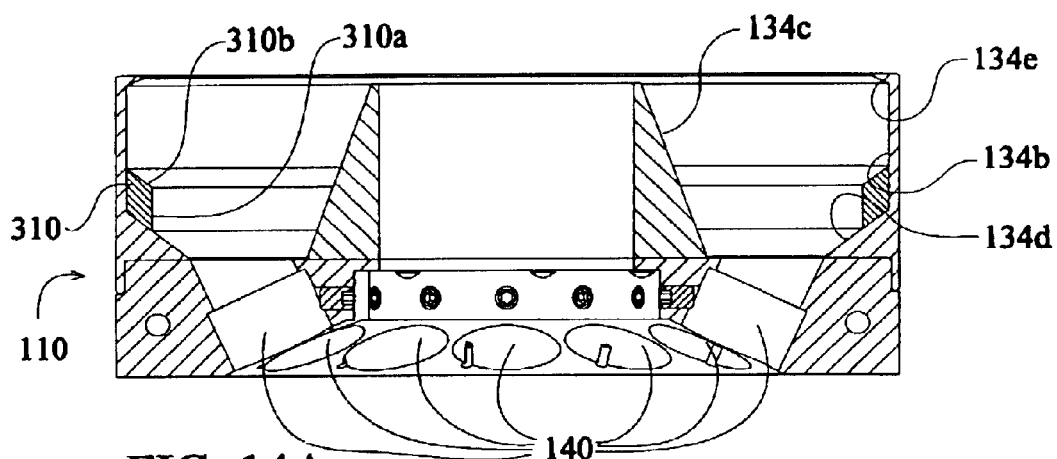
FIGS. 14A and 14B depict two alternative examples of a radiant heating device that incorporates replaceable inserts of different shape which are placed coaxially inside a reflector channel.
Figure 14B:
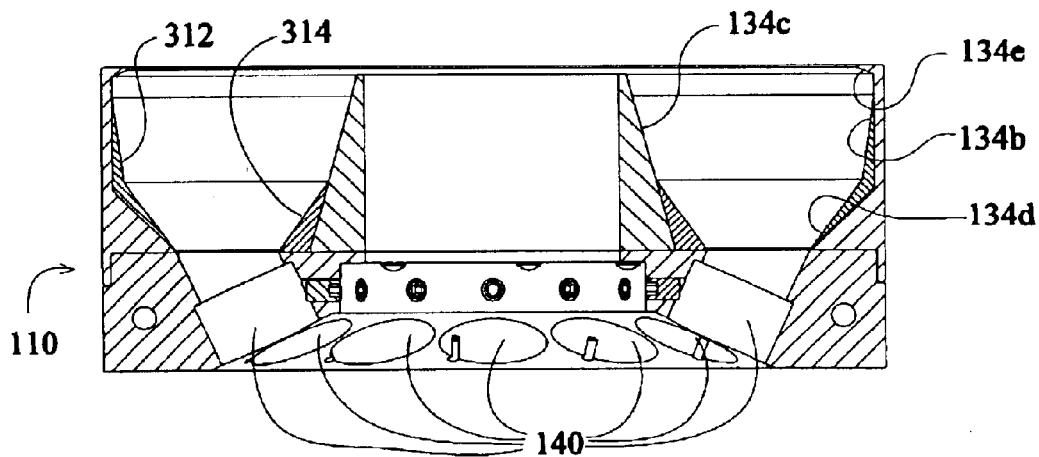
Figure 14C:
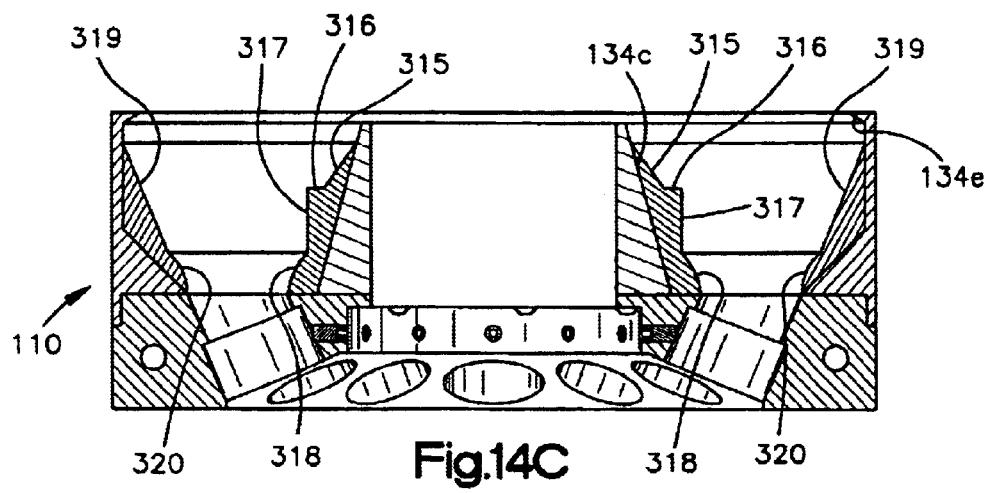
FIGS. 14C, 14D, and 14E depict three additional alternative examples of a radiant heating device that incorporates replaceable inserts of different shape which are placed coaxially inside a reflector channel.
Figure 14D:
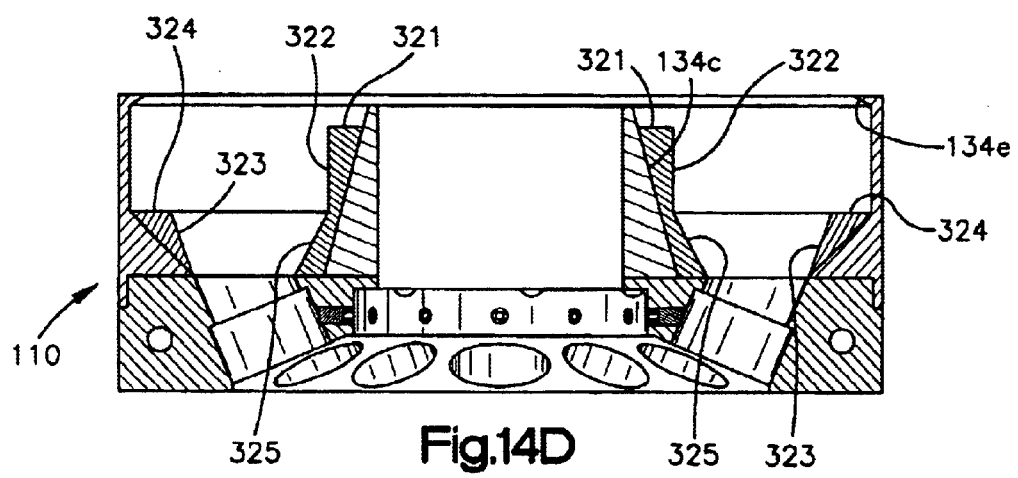
Figure 14E:
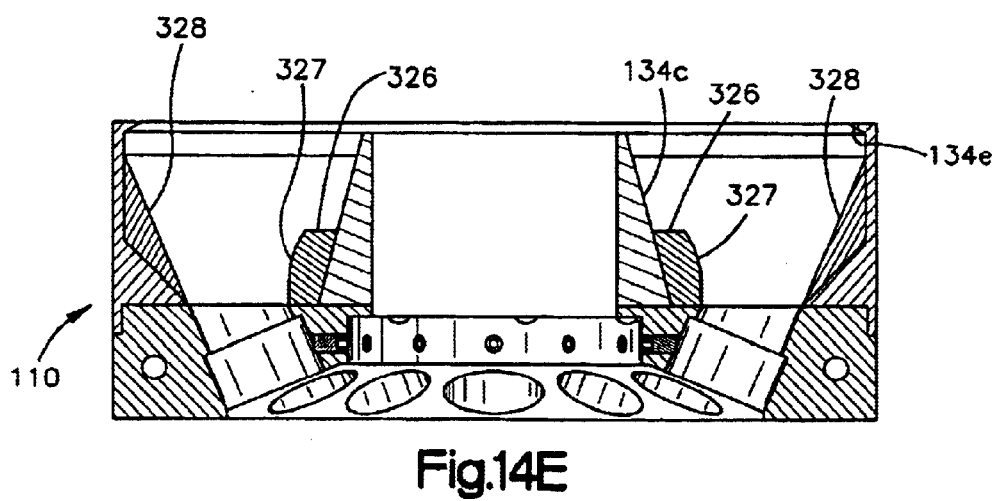

FIGS. 14A and 14B depict alternate the exemplary embodiments of the invention including inserts 310, 312, 314 that fit within the channel 134. The inserts can be fastened with suitable fasteners (not shown). In the configuration shown in FIG. 14A the insert 310 has a generally vertical wall 310a and a wall portion 310b that forms a part of a cone. In FIG. 14B the channel shape is modified by the use of two inserts 312, 314. The insert 314 changes the shape of the inner wall 134c to adjust the radiation reflecting characteristics of that wall 134c. The second insert 312 modifies the slope of the wall 134d as well as modifying the generally vertical outer wall 134b. Walls of the insert facing the radiant energy emitting bulbs are finished or coated with a gold coating as are the other reflecting surfaces to provide efficient reflection of the radiant energy off those surfaces. The radiant energy reflecting characteristics of the source 110 are modified in a controlled fashion based on a new walls geometry or shape for the channel 132 (FIG. 2). The purpose of this arrangement is to provide a cost effective and efficient way to reuse an array of initial reflector configuration for a different process application or different tool. The radiant energy source 110 of FIG. 14C incorporates one insert having surfaces that comprises a plane 316, a cylinder 317, a cone 315, and a convex curved surface of revolution 318 which are placed coaxial inside the reflector to redistribute part of the radiate energy in different directions. The radiant energy source 110 of FIG. 14C also incorporates a second insert having surfaces that comprises a cone 319 and a convex curved surface of revolution 320 which are placed coaxial inside the reflector to redistribute part of the radiate energy in different directions. The radiant energy source 110 of FIG. 14D incorporates one insert having surfaces that comprises a plane 321, a cylinder 322, and a cone 325 which are placed coaxial inside the reflector to redistribute part of the radiate energy in different directions. The radiant energy source 110 of FIG. 14D also incorporates a second insert having surfaces that comprises a plane 324 and a cone 323 which are placed coaxial inside the reflector to redistribute part of the radiate energy in different directions. The radiant energy source 110 of FIG. 14E incorporates one insert having surfaces that comprises a plane 326 and a convex curved surface of revolution 327 which are placed coaxial inside the reflector to redistribute part of the radiate energy in a different direction. The radiant energy source 110 of FIG. 14E also incorporates a second insert having a surface that comprises a cone 328 which is placed coaxial inside the reflector to redistribute part of the radiate energy in a different direction.

Figure 15:
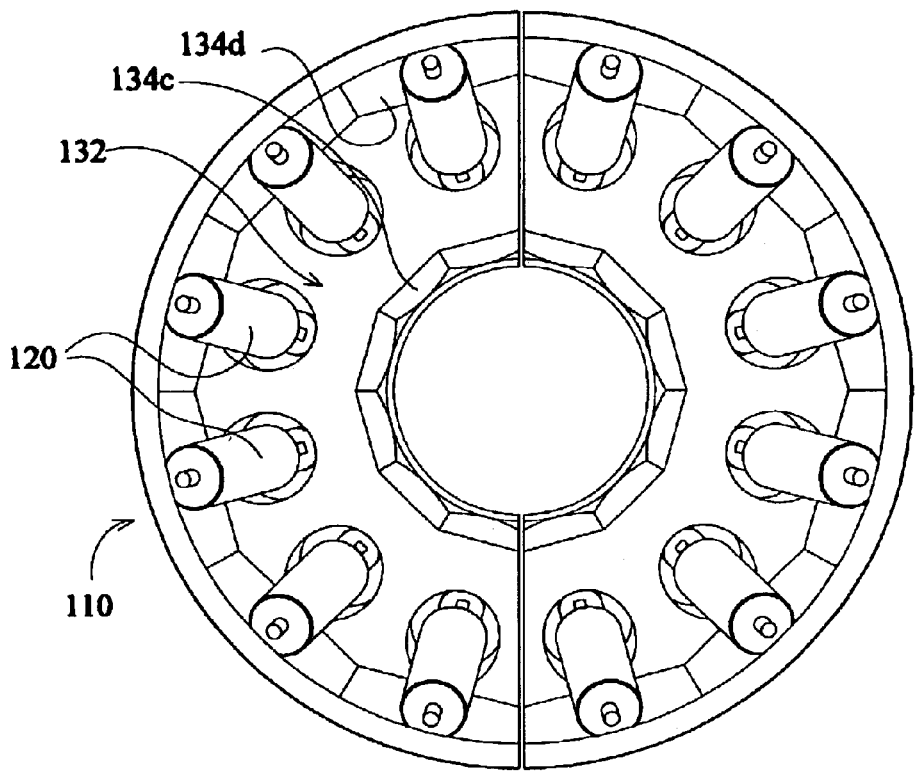
FIGS. 15 and 16 depicts top view on array and array base where some of reflecting surfaces namely 134c and 134d performed as inscribed polyhedron surfaces.
Figure 16:
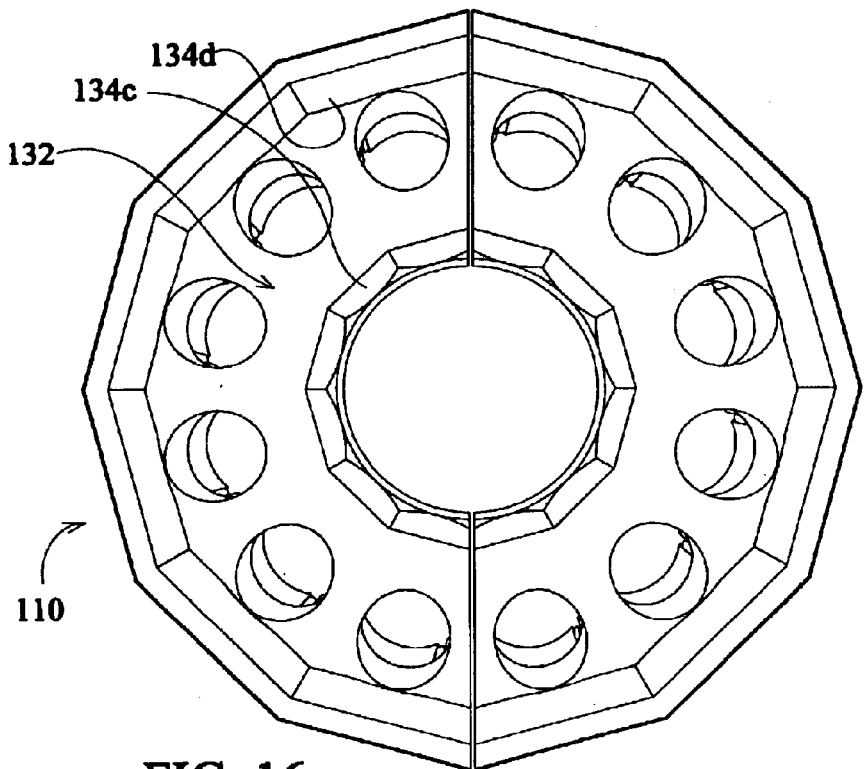

Turning to FIGS. 15 and 16, these figures illustrate an alternate embodiment of the invention wherein the reflecting walls 134c, 134d that form inner and outer walls of the channel 132 are defined by inscribed polyhedron surfaces with a number of faces or facets equal to a number of heating elements in the array of heating. The embodiment of FIGS. 15 and 16 may be preferably for use in making the fabrication of the source more economic.

Figure 17A:
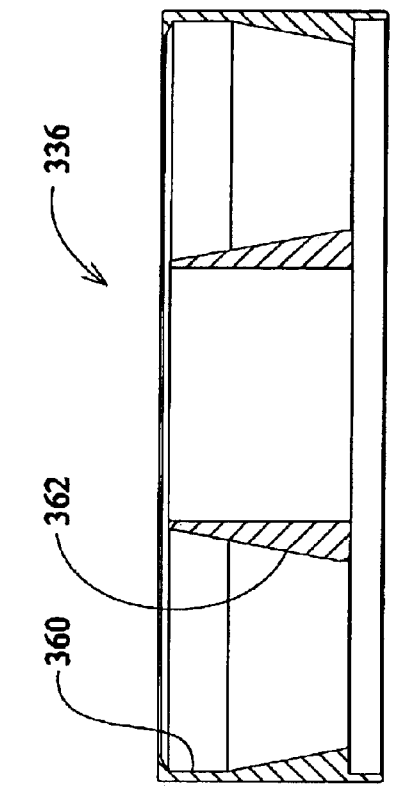
FIGS. 17A, 17B and 17C illustrate use of a single reflector base with multiple reflector channel members that can be used for alternate radiant energy delivery to a region of a workpiece.
Figure 17B:
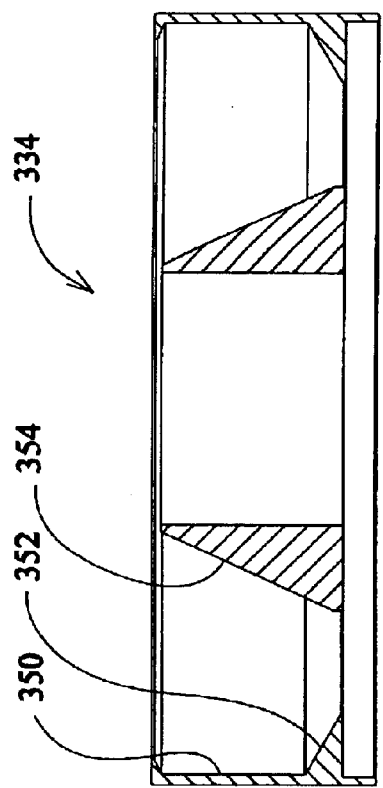
Figure 17C:
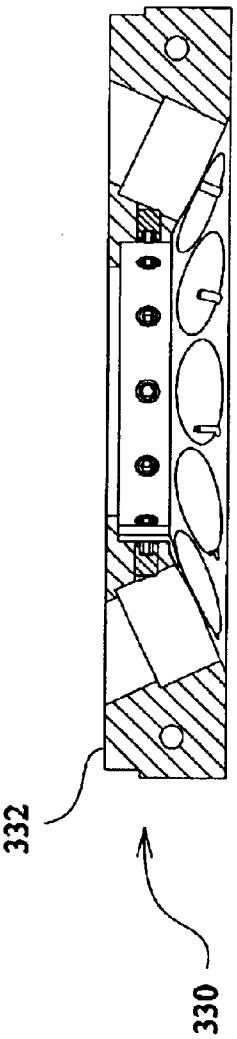

FIGS. 17A–17C illustrate alternate use of the invention. A base 330 is depicted in FIG. 17C. This base 330 has a top surface 332 which supports either of the two channel defining members 334, 336 shown in FIGS. 17A and 17B respectively. In the embodiment of FIG. 17A the channel defining member 334 has a substantially vertical outer wall 350 that meets a cone shaped outer wall 352. An inner wall 354 is also cone shaped and defines a sloped inner boundary for the channel which accommodates the multiple heating sources spaced within the circumference of the channel. In the embodiment of FIG. 17B a vertical segment 360 of the channel boundary is shorter than the vertical outer wall 350 of FIG. 17A and the inner cone shaped wall 362 has a greater slope than the inner wall 354 of FIG. 17A. Each of the two channel defining members 334, 336 has its own radiant energy reflecting characteristics and is selectively chosen for different process application or tools and attached to the base 330, for example, by means of suitable fasteners. The base is reused and process modification simplified with such arrangement.

Figure 18:
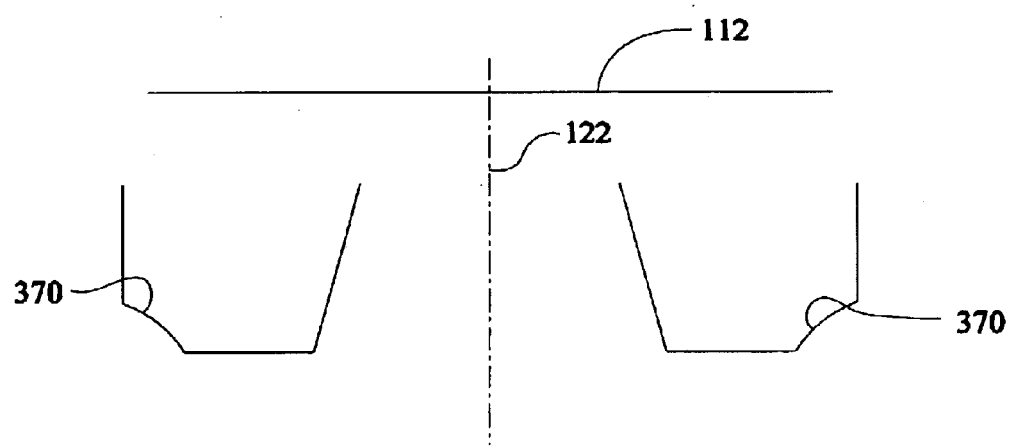
FIG. 18 is a schematic depiction of a reflector having a portion of its exterior or outer wall having a convex surface that faces the radiant heating elements.

FIG. 18 illustrates use of a outer wall portion 370 of the source reflector at least a part of which is made of curved surface of revolution. It may in section define a part of ellipse or parabola or circle or any other curve. Note, in FIG. 18 the reflecting surfaces of the source also includes portions that are straight lines that revolved around a center axis to form a cylinder or cone or horizontal surface. This curved line in FIG. 18 is convex facing a direction of the bulbs. Note, that prior art, for example household and others radiant heaters use a parabola or ellipse or similar shapes, that are concave facing a bulb and therefore concentrate the light to a particular region. Use of a convex shape such as the shape in FIG. 18, will spread the individual element energy from a given bulb over a larger area, making total, superposed from all elements heat distribution smoother and more uniform.

With a foregoing description in mind, however, it is understood that the description is only by way of example, that the invention is not limited to the particular embodiments described herein and that various rearrangements, modifications, and substitutions may be implemented with respect to the foregoing description without departing from the scope of the invention defined by the following claims and their equivalents.

What is claimed is:

1. A radiant source for heating a workpiece positioned relative to the radiant source comprising:
    a plurality of radiant heating elements, arranged in a single array that is generally concentric about a source center axis;
    a reflector having a reflecting surface that bounds a single channel which opens in a direction of a workpiece and that contains the heating elements of said single array, said reflector comprising inner, outer and bottom walls that extend around at least a portion of the center axis to define said single channel and that are surface finished for reflecting radiant energy emitted by the heating elements to a region occupied by the workpiece; and
    one or more replaceable reflecting inserts that comprises plane and/or cylinder and/or cone and/or a convex curved surfaces of revolution which are placed coaxial inside the said reflector to redistribute part of the radiated energy in a different direction;
    a bottom wall of said channel comprising a part of a plane and said inner and outer walls comprising a part of a cone surface of revolution spanning two or more adjacent heating elements that widen outwardly along a region of said channel between the bottom wall and said workpiece to reflect radiant energy toward the workpiece through a widened optical diaphragm.

2. A radiant source of claim 1 wherein the channel is bounding by a convex portion or portions as seen from a position of the heating elements that spans two or more adjacent heating elements.

3. A radiant source as in claim 1 where some or all of said reflecting surfaces are formed from a source base that supports the radiant heating elements.

4. A radiant source as in claim 1 comprising different sets of said coaxial reflectors of different shapes and a single reflector base, to allow different sets of reflectors to be installed on a common base.

5. A radiant source as in claim 1 which incorporates a wall having a lip portion that overhangs a portion of the channel to reflect energy back to other reflector surfaces that bound the channel to intercept and redirect back to the workpiece radiant energy that would miss the target but for the presence of the lip portion.

6. A radiant heat source as in claim 1, which includes a base for positioning the heating elements relative to the reflector which is mechanically independent from electrical connections that energize the radiant heating elements.

7. The radiant heat source of claim 1 where the heating elements of the single array comprise individual elongated bulbs that are angled with respect to center axis of the array or workpiece.

8. A radiant source as in claim 7 comprising an intermediate bushing, one for each heating element for supporting the heating elements relative to the reflector at an angle with respect to the center axis, said bushings comprising a high thermal conductivity material.

9. A radiant source of claim 7 wherein the reflector comprises a reflector base that at least in part defines the channel of the reflector and wherein the reflector base includes a number of through-passages for orienting the heating elements in said channel.

10. The radiant source of claim 9 additionally comprising bushings that fix the orientation of the heating elements and are positioned within the reflector base through-passages.

11. The radiant heater of claim 1 wherein an outer wall includes a cylindrical shaped portion.

12. The radiant heater of claim 11 wherein the outer wall includes a cone shaped portion that meets the cylindrical shaped portion of said outer wall.

13. A method for heating a workpiece comprising:
    providing a radiant heat reflector having one or more reflecting surfaces that form a channel that extends around at least a portion of a center axis wherein the reflecting surface includes inner and outer walls that form a part of a cone and/or a convex curved surface of revolution that widens outwardly toward a workpiece region;
    mounting a plurality of elongated radiant heating elements to a source base at an angle with respect to the center axis within the channel of the reflector in a single array that is generally concentric about the center axis such that the inner and outer walls of the channel span two or more adjacent heating elements to reflect radiant energy toward a workpiece region where some or all of said reflecting surfaces of the channel are formed from the source base that supports the radiant heating elements;
    inserting replaceable reflecting inserts of plane and/or cylinder and/or cone and/or curved convex surfaces of revolution which are placed coaxial inside the heat reflector to redistribute part of the radiant energy in a different direction; and controllably energizing the heating elements to emit radiant energy from the heating elements for directing radiant energy to the workpiece region.

14. The method of claim 13 additionally comprising finishing the reflecting surface with a radiant energy reflecting coating to reflect radiant energy emitted by the heating elements to the workpiece region.

15. The method of claim 13 wherein the step of mounting the heating elements is performed by coupling the heating elements to an intermediate bushing and attaching the bushing to the source base.

16. The method of claim 15 additionally comprising the step of attaching a heating element energizing circuit to electrical contacts whose position is fixed by the bushing.

17. The method of claim 13 comprising inserting different sets of said coaxial reflectors of different shapes into the channel defined by the source base to allow different sets of reflectors to be installed on a common base.

18. A method for heating a workpiece comprising:
providing a radiant heat reflector having a reflecting surface that forms a channel that extends around at least a portion of a center axis wherein the reflecting surface includes inner and outer walls that form a part of a cone and/or a convex curved surface of revolution that widens outwardly toward a workpiece region;
mounting a plurality of elongated radiant heating elements to a source base at an angle with respect to the center axis within the channel of the reflector in a single array that is generally concentric about the center axis such that the inner and outer walls of the channel span two or more adjacent heating elements to reflect radiant energy toward a workpiece region;
controllably energizing the heating elements to emit radiant energy from the heating elements for directing radiant energy to the workpiece region; and
redirecting energy by intercepting energy from the heating elements with a circumferential lip portion that overhangs a portion of the channel to reflect energy back to other reflector surfaces that bound the channel.

19. A radiant source for heating a workpiece positioned relative to the radiant source comprising:
a plurality of radiant heating elements, arranged in an array that is generally concentric about a source center axis; and
a reflector having a reflecting surface that bounds a circumferential channel which opens in a direction of a workpiece and that contains the heating elements, said reflector comprising walls that extend around at least a portion of the center axis and that are surface finished for reflecting radiant energy emitted by the heating elements to a region occupied by the workpiece;
the inner and outer walls of said channel comprising part of a plane and/or cylinder and/or a cone surface of revolution spanning two or more adjacent heating elements to reflect radiant energy toward the workpiece and including a circumferential lip portion that overhangs a portion of the circumferential channel to reflect energy back to other reflector surfaces that bound the channel to intercept and redirect radiant energy that would miss the target but for the presence of the lip portion.

20. A radiant source for heating a workpiece positioned relative to the radiant source comprising:
a plurality of radiant heating elements, arranged in an array that is generally concentric about a source center axis; and
a reflector having a reflecting surface that bounds a channel which opens in a direction of a workpiece and that contains the heating elements, said reflector comprising walls that extend around at least a portion of the center axis and that are surface finished for reflecting radiant energy emitted by the heating elements to a region occupied by the workpiece;
the walls of said channel comprising a part of a plane and/or cylinder and/or a cone surface of revolution spanning two or more adjacent heating elements to reflect radiant energy toward the workpiece; and
replaceable reflecting inserts that comprises plane and/or cylinder and/or cone and/or a convex curved surfaces of revolution which are placed coaxial inside the said reflector to redistribute part of radiate energy in a different direction.

21. A method for heating a workpiece comprising:
providing a radiant heat reflector having a reflecting surface that forms a channel that extends around at least a portion of a center axis wherein the reflecting surface includes walls that form a part of a cylinder and/or a cone and/or a convex to heating elements curved surface of revolution;
mounting a plurality of elongated radiant heating elements to a base at an angle with respect to the center axis within the channel of the reflector in an array that is generally concentric about the center axis such that the walls of the channel span two or more adjacent heating elements to reflect radiant energy toward a workpiece region;
placing reflecting inserts that that comprises plane and/or cylinder and/or cone and/or a convex curved surfaces of revolution coaxially inside the channel to control reflection of radiate energy within said channel; and
controllably energizing the heating elements to emit radiant energy from the heating elements for directing radiant energy to the workpiece region.

22. A method for heating a workpiece comprising:
providing a radiant heat reflector having a reflecting surface that forms a circumferential channel that extends around at least a portion of a center axis wherein the reflecting surface includes walls that form a part of a cylinder and/or a cone and/or a convex curved surface of revolution;
mounting a plurality of elongated radiant heating elements to a base at an angle with respect to he center axis within the channel of the reflector in an array that is generally concentric about the center axis such that the walls of the channel span two or more adjacent heating elements to reflect radiant energy toward a workpiece region;
positioning a circumferential lip portion that overhangs a portion of the circumferential channel to reflect energy back to other reflector surfaces that bound the channel to intercept and redirect radiant energy that would miss the workpiece but for the presence of the lip portion; and
controllably energizing the heating elements to emit radiant energy from the heating elements for directing radiant energy to the workpiece region.

* * * * *